(12) United States Patent
Baik et al.

(10) Patent No.: US 7,119,375 B2
(45) Date of Patent: Oct. 10, 2006

(54) LIGHT EMITTING DIODE AND METHOD FOR MANUFACTURING THE SAME

(75) Inventors: Doo Go Baik, Seoul (KR); Bang Won Oh, Kyungki-do (KR); Hak Kyu Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/012,331

(22) Filed: Dec. 16, 2004

(65) Prior Publication Data

US 2005/0093011 A1 May 5, 2005

Related U.S. Application Data

(62) Division of application No. 10/464,514, filed on Jun. 19, 2003, now abandoned.

(30) Foreign Application Priority Data

Dec. 10, 2002 (KR) ................. 2002-78456

(51) Int. Cl.
*H01L 29/22* (2006.01)

(52) U.S. Cl. .......... 257/98; 257/E33.063; 257/E33.068

(58) Field of Classification Search .................. 438/29, 438/38; 257/13, 98, E33.063, E33.068
See application file for complete search history.

(56) References Cited

U.S. PATENT DOCUMENTS

| | | | |
|---|---|---|---|
| 4,643,532 A | 2/1987 | Kleiman | |
| 5,376,580 A | 12/1994 | Kish et al. | ..................... 438/26 |
| 6,287,882 B1 | 9/2001 | Chang et al. | |
| 6,292,243 B1 * | 9/2001 | Shingu et al. | .............. 349/122 |
| 6,417,478 B1 | 7/2002 | Shiraishi et al. | |
| 6,861,281 B1 * | 3/2005 | Uemura et al. | ............... 438/93 |
| 2002/0024981 A1 * | 2/2002 | Tojo et al. | ..................... 372/45 |
| 2003/0025572 A1 * | 2/2003 | Maekawa et al. | ........... 333/132 |
| 2003/0087463 A1 | 5/2003 | Horng et al. | |

FOREIGN PATENT DOCUMENTS

| | | |
|---|---|---|
| JP | 6-302857 | 10/1994 |
| JP | 2000-228537 | 8/2000 |
| JP | 2001-332762 | 11/2001 |

* cited by examiner

*Primary Examiner*—Trung Dang
(74) *Attorney, Agent, or Firm*—Lowe Hauptman & Berner, LLP.

(57) ABSTRACT

A light emitting diode (LED) includes a substrate, a first conductive clad layer formed on the substrate, an active layer formed on the first conductive clad layer, a second conductive clad layer formed on the active layer, an alumina ($Al_2O_3$) layer formed on the lower surface of the substrate, and an aluminum layer formed on the lower surface of the alumina ($Al_2O_3$) layer. The substrate may be removed, and the aluminum layer and the alumina layer are formed directly on the lower surface of the first conductive clad layer.

5 Claims, 7 Drawing Sheets

LIGHT EMITTING DIODE AND METHOD FOR MANUFACTURING THE SAME

This application is a divisional of 10/464,514 filed Jun. 19, 2003, now abandoned.

BACKGROUND OF THE INVENTION

1. Field of the Invention

The present invention relates to a light emitting-diode (LED) and a method for manufacturing the same, and more particularly to a LED comprising a reflective layer including an aluminum layer and an alumina layer so as to improve photoemissive efficiency, which is easily formed using an anode bonding technique, and a method for manufacturing the LED.

2. Description of the Related Art

Generally, light emitting diodes (LEDs) are semiconductor devices made of compounds such as GaAs, AlGaAs, GaN, InGaN, AlGaInP, etc., and are widely used as various light sources in the fields of optical communications and electronic devices.

One of essential factors for determining characteristics of the LED devices is luminance. There have been made many attempts to improve the luminance of LED devices by variously changing their designs.

For example, in order to improve the luminance of LEDs, the LEDs comprise at least one active layer for generating light by recombining electrons with holes. Among these LEDs, a LED comprising active layers, each layer with a thickness of more than 100 Å, is referred to as a multiwell (MW) LED, and a LED comprising active layers, each layer with a thickness of less than approximately 100 Å, is referred to a multiple quantum well (MQW) LED. On the other hand, a LED comprising a single active layer is referred to as a double heterostructure (DH) LED or a single quantum well (SQW) LED. That is, there have been made attempts to improve the luminance of LEDs by adjusting the number and/or the thicknesses of the active layers.

Such conventional techniques have trended toward maximizing light generated by the active layers. However, the aforementioned techniques for improving the luminance of generated light by changing the structure of the active layers create a complicated design of the LED due to increased number of materials, and it is difficult to apply such techniques to a practical process for manufacturing the LED.

In addition to the aforementioned conventional techniques, there has been made an attempt to improve the structure of the LED so as to effectively use light in a uniform quantity, emitted from the active layers.

For example, a reflective layer is formed on the lower surface of a LED, thereby minimizing the amount of light emitted in unnecessary directions, and improving the luminance of light emitted in a desired direction. This technique is embodied by forming a back reflective layer made of a metal with high reflectance such as Al, Ag, or etc., on the lower surface of the LED. FIGS. 1a and 1b illustrate one example of the above conventional technique.

With reference to FIGS. 1a, a LED 10 comprises a substrate 2, a n-type first conductive clad layer 4 formed on the substrate 2, an active layer 6 formed on the first conductive clad layer 4, and a p-type second conductive clad layer 8 formed on the active layer 6. Conventionally, the first conductive clad layer 4 is an n-type layer, and the second conductive clad layer 8 is a p-type layer. Since such configuration is general in LEDs, it is also applied to the present invention. However, the first conductive clad layer 4 may be a p-type layer, and the second conductive clad layer 8 may be an n-type layer. Therefore, selectively, the LED may be grown on a p-type substrate or an n-type substrate. Further, in case the clad layer is formed out of a semiconductor material made of a GaN compound, a sapphire substrate may be used.

As shown in FIG. 1a, the n-type clad layer 4 is electrically connected to a n-type Ohmic contact layer 11 formed at an area of the upper surface of the n-type clad layer 4 without the active layer 6 and the p-type clad layer 8 grown thereon (more specifically, an area of the upper surface of the n-type clad layer 4 exposed to the outside by growing the active layer 6 and the p-type clad layer 8 thereon and selectively removing the grown active layer 6 and p-type clad layer 8), and the p-type clad layer 8 is electrically connected to a p-type Ohmic contact layer 13. A reflective layer 15 made of a metal with high reflectance is formed on the lower surface of the substrate 2.

When voltage is applied to the Ohmic contact layers 11 and 13 of the LED 10, electrons from the n-type clad layer 4 and holes from the p-type clad layer 8 are injected into the active layer 6. Then, the electrons and the holes injected into the active layer 6 are recombined with each other, thereby generating light.

FIG. 1b schematically illustrates light emission from the active layer 6. With reference to FIG. 1b, for example, the light generated from a point (P) of the active layer 6 is emitted in an upward direction (a) of the LED 10, i.e., a direction desired by users, and in a downward direction (b) of the LED 10. Herein, the quantities of light emitted in the two directions are nearly the same.

In the LED 10 of FIG. 1b, the light (b) emitted in the downward direction of the LED 10 reaches the reflective layer 15 disposed on the lower surface of the substrate 2, and is reflected by the reflective layer 15 with high reflectance. Then, a certain quantity of the reflected light (b') is again emitted in the upward direction of the LED 10 due to the high reflectance of the reflective layer 15 and emitted in the upper direction of the LED 10. Therefore, the reflective layer 15 serves to concentrate the light generated from the active layer 6 so as to emit the light in the upward direction of the LED 10, thereby minimizing the unnecessary loss light.

However, the reflective layer 15 as shown in FIGS. 1a and 1b insufficiently improves the photoemissive efficiency of the LED 10. Particularly, since much of the light emitted toward the reflective layer 15 or reflected from the reflective layer 15 is absorbed by the sapphire substrate 2 with a large thickness, the improvement in photoemissive efficiency of the LED 10 by the reflective layer 15 is not great.

Further, the reflective layer 15 is formed by an additional deposition step after manufacturing the LED 10. Therefore, the entire manufacturing process of the LED 10 is complicated and its production cost is increased. Moreover, it is very difficult to form an Al layer or an Ag layer with excellent adhesiveness on the lower surface of the sapphire substrate using a conventional deposition device.

Therefore, there are required a LED comprising a reflective layer having an improved configuration and being easily manufactured, and a method for manufacturing the LED, thereby more effectively increasing the luminance of the LED.

SUMMARY OF THE INVENTION

Therefore, the present invention has been made in view of the above problems, and it is an object of the present invention to provide a LED comprising a reflective layer formed on the lower surface of the LED, including an aluminum layer and an alumina layer with different reflectances, thereby improving reflective characteristics of the reflective layer.

It is another object of the present invention to provide a LED comprising a reflective layer formed on an exposed surface of the LED after removing a substrate, including an aluminum layer and an alumina layer with different reflectances, thereby improving luminance of the LED as well as reflective characteristics the LED.

It is yet another object of the present invention to provide a method for easily manufacturing a LED with excellent luminance, in which a reflective layer including an aluminum layer and an alumina layer with different reflectances is formed on a surface of the LED by compressing the aluminum layer on the surface of the LED at a high temperature under an oxygen atmosphere.

In accordance with one aspect of the present invention, the above and other objects can be accomplished by the provision of a light emitting diode (LED) comprising: a substrate; a first conductive clad layer formed on the substrate; an active layer formed on the first conductive clad layer; a second conductive clad layer formed on the active layer; an alumina ($Al_2O_3$) layer formed on the lower surface of the substrate; and an aluminum layer formed on the lower surface of the alumina ($Al_2O_3$) layer.

In accordance with a further aspect of the present invention, there is provided a light emitting diode (LED) comprising: a glass layer; an aluminum layer formed on the glass layer; an alumina ($Al_2O_3$) layer formed on the aluminum layer; a first conductive clad layer formed on the alumina ($Al_2O_3$) layer; an active layer formed on the first conductive clad layer; and a second conductive clad layer formed on the active layer.

A back reflective structure employed by the LED of the present invention includes the aluminum layer and the alumina layer. Preferably, an alumina layer may be additionally formed on the lower surface of the aluminum layer, and the alumina layer serving as a reflective layer may comprise Al atoms at less than 60% of its total weight.

In accordance with another aspect of the present invention, there is provided a method for manufacturing a light emitting diode (LED), comprising the steps of: preparing a substrate; forming a first conductive clad layer on the substrate; forming an active layer on the first conductive clad layer; forming a second conductive clad layer on the active layer; and bonding the aluminum film to the lower surface of the substrate by heating and compressing the aluminum film and the substrate under an oxygen atmosphere so as to form an aluminum layer provided with an alumina ($Al_2O_3$) layer at an interface thereof.

In accordance with yet another aspect of the present invention, there is provided a method for manufacturing a light emitting diode (LED), comprising the steps of: preparing a substrate; forming a first conductive clad layer on the substrate; forming an active layer on the first conductive clad layer; forming a second conductive clad layer on the active layer; removing the substrate so as to expose the lower surface of the first conductive clad layer to the outside; successively disposing an aluminum film and a glass layer on the lower surface of the first conductive clad layer under an oxygen atmosphere; and bonding the aluminum film to the first conductive clad layer and the glass layer to the aluminum film by heating and compressing the three layers.

In the bonding step of the method for manufacturing the LED, the alumina layer is formed on the interface of the aluminum film with the substrate or the first conductive clad layer by heating and compressing the aluminum film and the substrate or the first conductive clad layer under the oxygen atmosphere. In order to form the alumina layer, preferably, a heating temperature applied in the bonding step may be in the range of 250° C. to 500° C., and a pressure applied to the substrate and the aluminum layer in the bonding step may be at least 30 gf/cm². In order to form a firmer bonding structure of the aluminum layer to the substrate or the first conductive clad layer, preferably, a DC voltage in the range of 300V to 600V may be applied to the substrate or the first conductive clad layer in the bonding step.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 2:
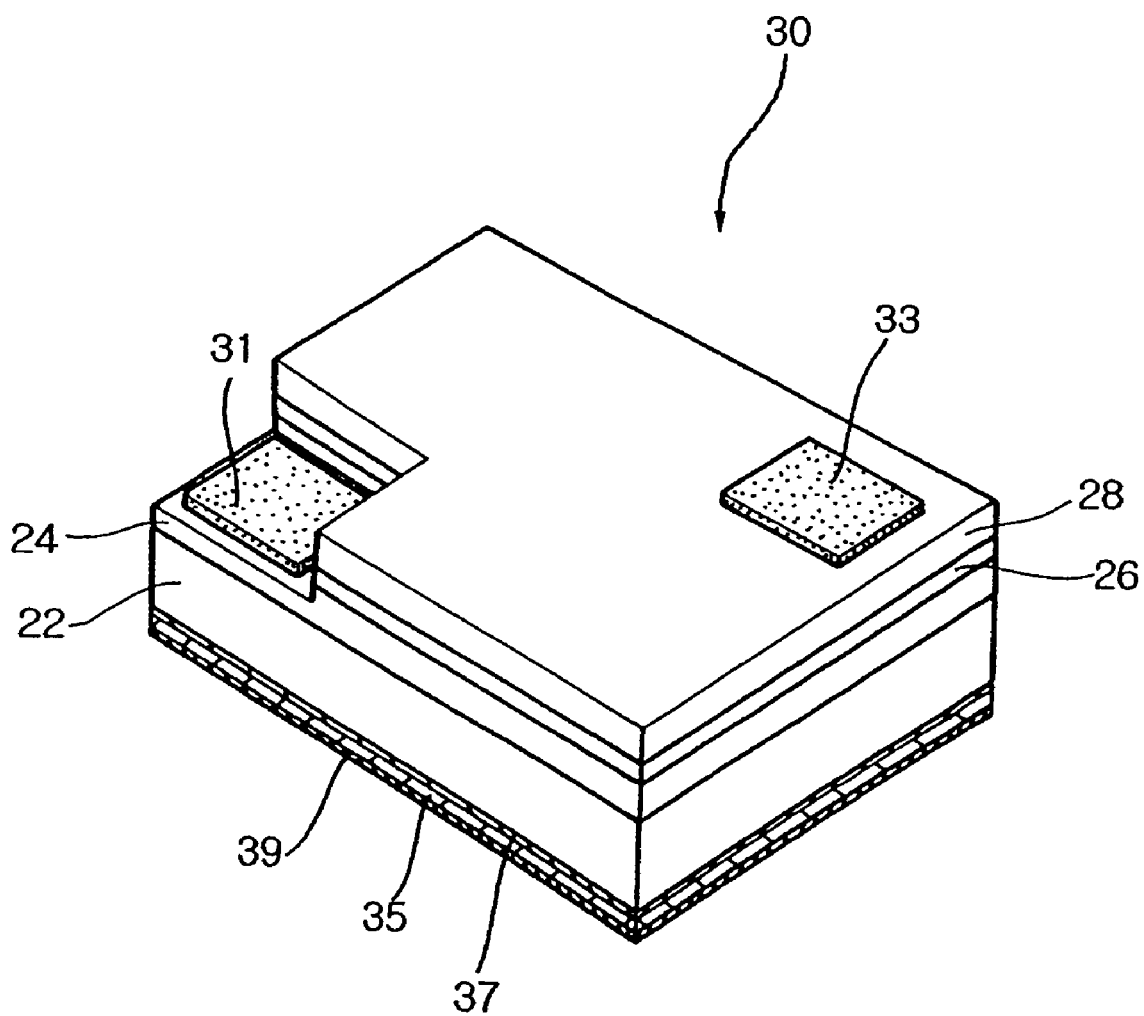
FIG. 2 is a perspective view of a LED in accordance with one embodiment of the present invention.

FIG. 2 is a perspective view of a LED in accordance with one embodiment of the present invention.

Figure 1A:
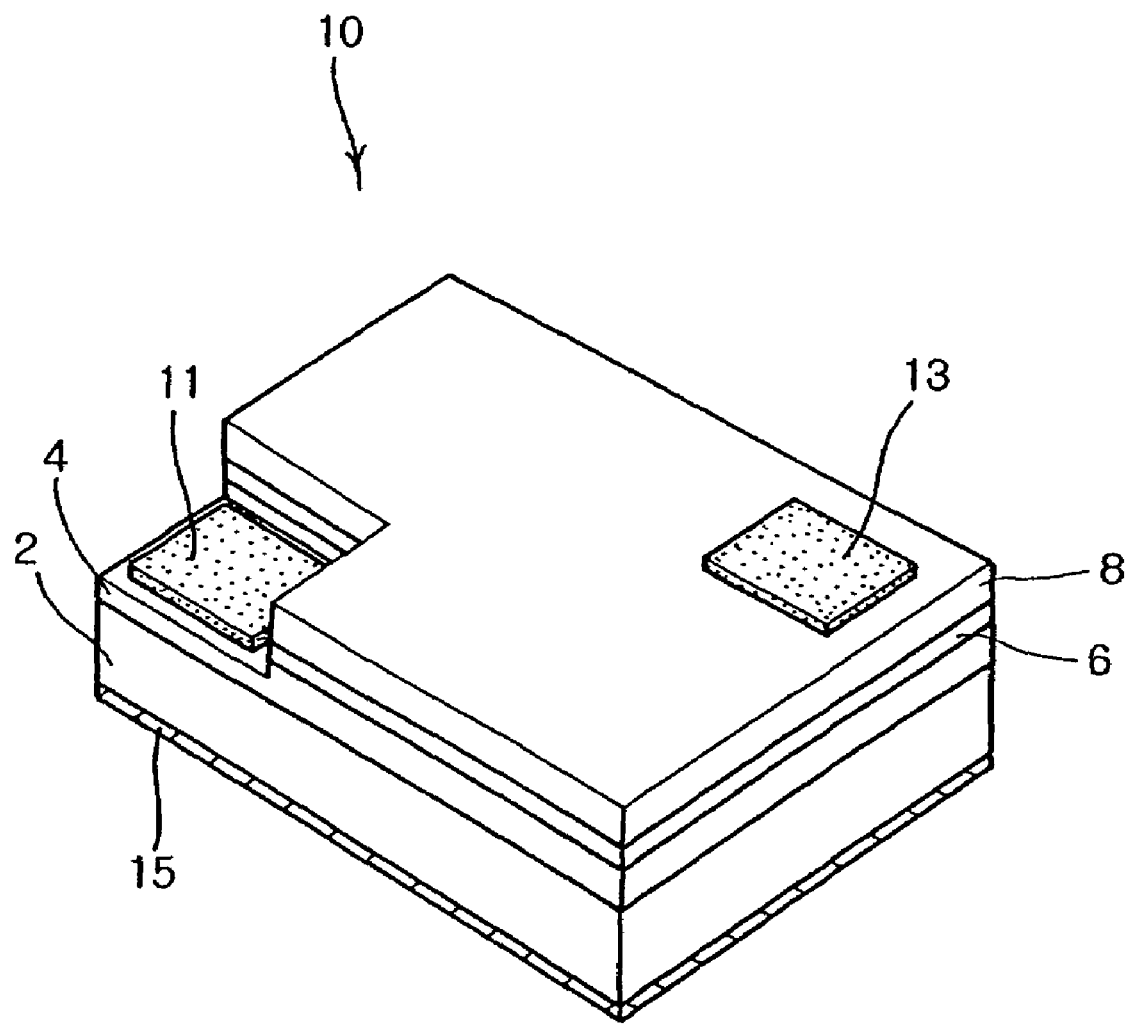
FIGS. 1a and 1b are a perspective view and a side view of a conventional light emitting diode (LED)
Figure 1B:
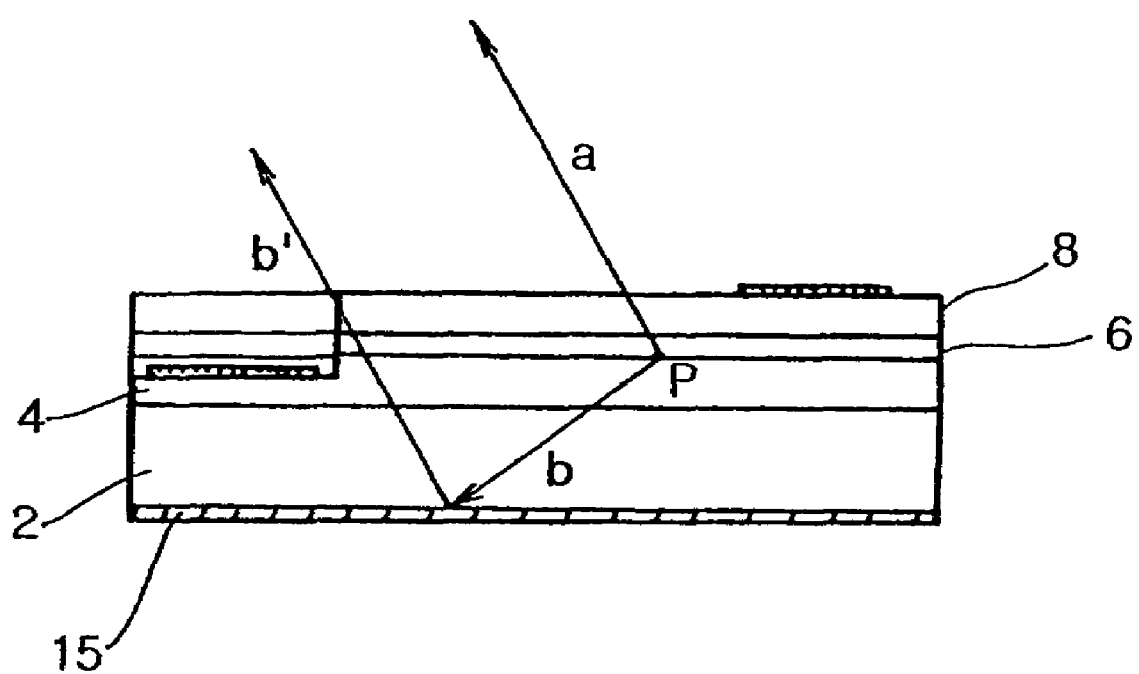

With reference to FIG. 1, a LED 20 of this embodiment of the present invention comprises a substrate 22, a first n-type clad layer 24 formed on the substrate 22, an active layer 26 formed on the n-type clad layer 24, and a second p-type clad layer 28 formed on the active layer 26.

The same as the LED 10 of FIG. 1a, the LED 20 further comprises an n-type Ohmic contact layer 31 formed on the n-type clad layer 24 and a p-type Ohmic contact layer 33 formed on the p-type clad layer 28. The first and second-conductive clad layers 24 and 28 and the active layer 26 are made of a semiconductor material of group III to V such as GaN, and a sapphire substrate is used as the substrate 22.

The LED 20 of the present invention is characterized in that an aluminum (Al) layer 35 with high reflectance is formed on the lower surface of the substrate 22 and an aluminum oxide or alumina ($Al_2O_3$) layer 37 with lower reflectance than that of aluminum layer 35 is formed on the aluminum layer 35. Herein, the aluminum layer 35 and the alumina layer 37 serve as a single reflective layer.

Conventionally, the reflective layer is made of only a metal with high reflectance such as Ag or Al. However, the reflectance of the conventional metal-made reflective layer is insufficient. Therefore, the present inventor(s) has(have)

researched a method for improving the reflectance of the reflective layer, and consequently, considering optical admittance theory for highly reflective coatings, found that higher reflectance is obtained by using two layers with different reflectances rather than using a single layer with high reflectance. A back reflective structure obtained by the above method is achieved by the aluminum layer 35 and the alumina layer 37 shown in FIG. 2.

The reflective structure employed by this embodiment of the present invention is obtained by additionally forming the alumina layer 37 with a comparatively low reflectance on the aluminum layer 35 with comparatively high reflectance. As described above, such reflective layer structure comprising the aluminum layer 35 and the alumina layer 37 has reflectance higher than that of the pure aluminum layer 35, thereby being advantageous in terms of reflective effect and improving photoemissive effect of the LED.

Further, the alumina layer 37 assists the aluminum layer 35 to be firmly bonded to the substrate 22. In order to form a firmer boding of the aluminum layer 35 to the first conductive clad layer 24, the alumina layer 37 preferably comprises Al atoms at less than approximately 60% of its total weight.

As shown in FIG. 2, the LED 20 of this embodiment of the present invention further comprises another alumina layer 39 formed on the lower surface of the aluminum layer 35 (Hereinafter, the alumina layer 37 serving as the reflective layer is referred to as an upper alumina layer, and the alumina layer 39 is referred to as a lower alumina layer.). In this embodiment, the lower alumina layer 39 serves to protect the LED 20 from physical or mechanical stresses during subsequent steps or in use.

In FIG. 2, in case the aluminum layer 35 or the lower alumina layer 39 is formed on the lower surface of the LED 20, a glass layer (not shown) serving as a supporter like the substrate 22 may be additionally formed on the lower surface of the lower alumina layer 39.

Figure 3:
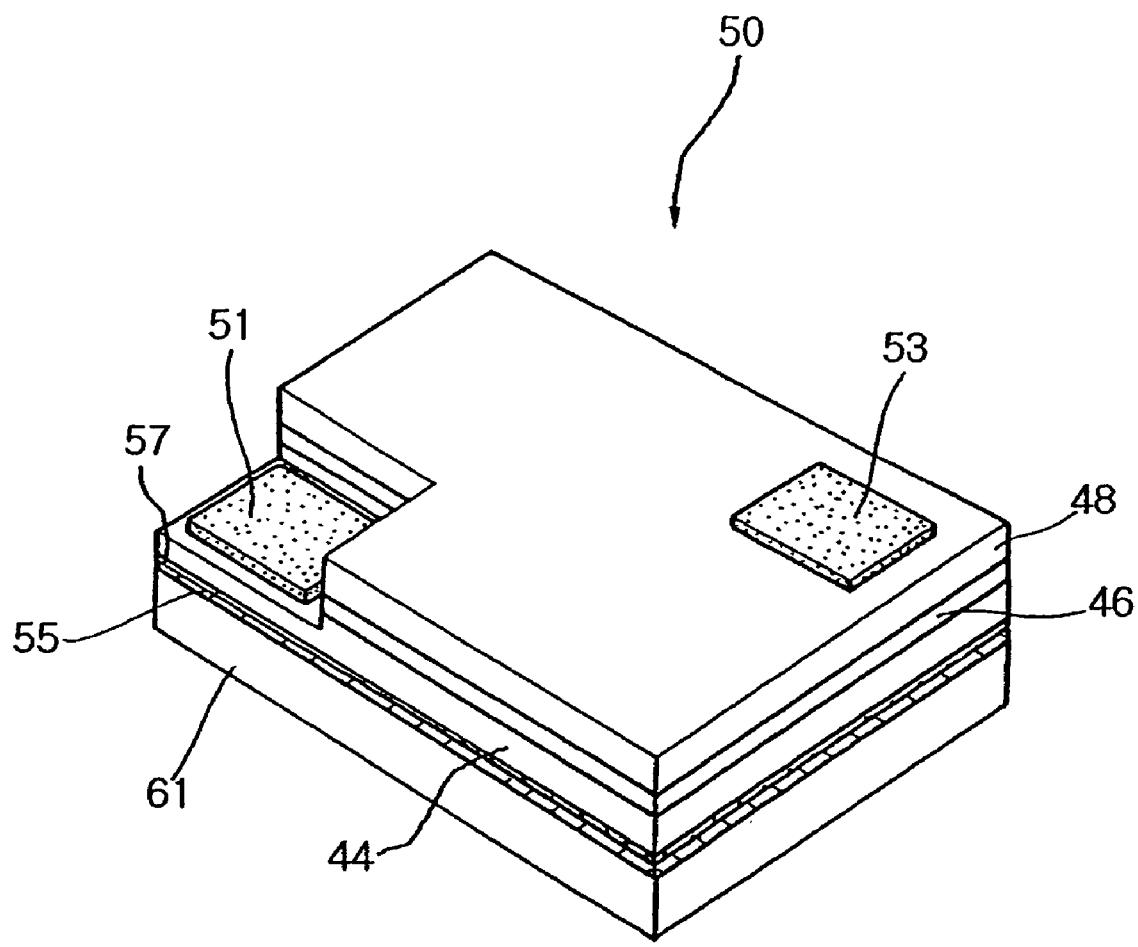
FIG. 3 is a perspective view of a LED in accordance with another embodiment of the present invention.

FIG. 3 is a perspective view of a LED in accordance with another embodiment of the present invention.

With reference to FIG. 3, a LED 50 comprises a glass layer 61, an aluminum layer 55, an alumina layer 57, an n-type clad layer 44, an active layer 46, and a p-type clad layer 48.

The LED 50 further comprises an n-type Ohmic contact layer 51 formed on the n-type clad layer 44, and a p-type Ohmic contact layer 53 formed on the p-type clad layer 48. The clad layers 44 and 48 and the active layer 46 are made of a semiconductor material of group III to V such as GaN.

Differently from the LED 20 of FIG. 2, the LED 50 of this embodiment does not comprise a substrate such as a sapphire substrate. Conventionally, in order to improve the reflective effect of the reflective layer, the sapphire substrate is removed from the LED and a silicon layer serving as a reflective layer and a supporter is formed on the upper surface of the LED. However, in such conventional manner, the expensive silicon layer having reflectance smaller than that of the aluminum layer must be used, thereby increasing the production cost of the LED.

In order to overcome the above problems, another embodiment of the present invention provides an excellent reflective structure constructed by forming the alumina layer 57 and the aluminum layer 55, serving as a reflective layer, directly on the lower surface of the n-type clad layer 44. Further, instead of the substrate or the silicon layer serving to support the LED, the glass layer 61 is formed on the lower surface of the aluminum layer 55, thereby providing a more stable structure of the LED 50.

The LED 50 of FIG. 3 is obtained by growing the active layer 46 and the clad layers 44 and 48 on a substrate using a semiconductor material, removing the substrate, and bonding the alumina layer 57, the aluminum layer 55, and the glass layer 61 to the lower surface of the n-type clad layer 44. The detailed manufacturing process of the LED 50 will be described later.

Similarly to the FIG. 2, the reflective structure of this embodiment is obtained by additionally forming the alumina layer 57 with comparatively low reflectance on the aluminum layer 55 with comparatively high reflectance. Preferably, the alumina layer 57 comprises Al atoms at less than 60% of its total weight, thereby forming a firmer bonding structure between the n-type clad layer 44 and the aluminum layer 55.

Although not shown in FIG. 3, the LED 50 of this embodiment may comprise, on the lower surface of the aluminum layer 55, another alumina layer like the lower alumina layer 37 of FIG. 2. In this case, the additional alumina layer is interposed between the glass layer 61 and the aluminum layer 55.

Further, the present invention provides a method for manufacturing a LED comprising a reflective layer with excellent reflective characteristics.

The method for manufacturing the LED of the present invention comprises the steps of successively forming a first conductive clad layer, an active layer, and a second conductive clad layer on a substrate, and bonding an aluminum layer to the flower surface of the substrate by applying heat and pressure thereto under an oxygen atmosphere so that an alumina ($Al_2O_3$) layer is formed at an interface of the aluminum layer and the substrate.

In the method for manufacturing the LED in accordance with the present invention, a reflective layer is formed out of Al foil using an anode bonding process, without a deposition device. Thereby, the reflective layer with excellent adhesiveness is more easily formed on the lower surface of the substrate such as a sapphire substrate.

Figure 4A:
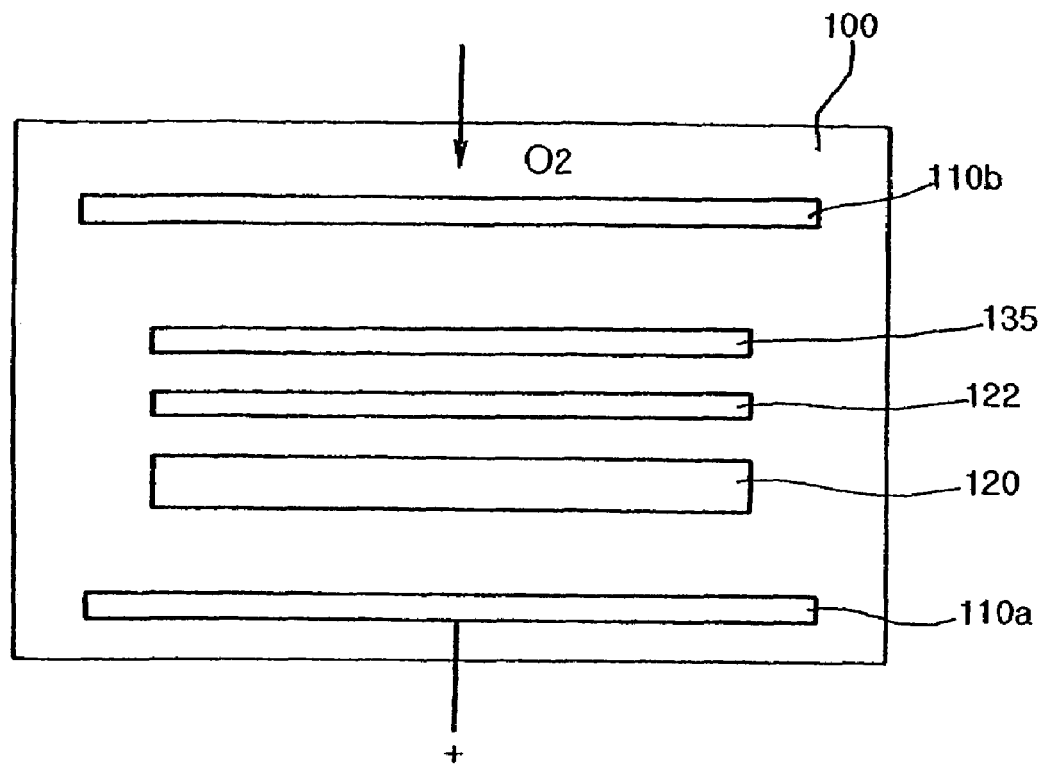
FIGS. 4a and 4b are schematic views illustrating a bonding step for forming a back reflective structure in a method, for manufacturing a. LED in accordance with one embodiment of the present invention.
Figure 4B:
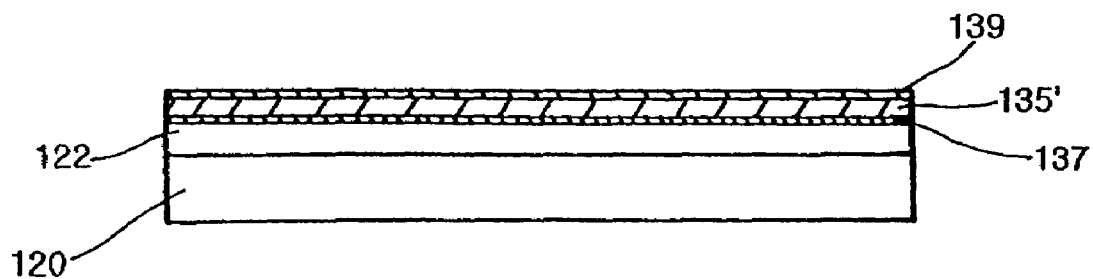

In a manner for forming a reflective layer using the anode bonding process employed by the present invention, the aluminum layer is heated and compressed under the oxygen atmosphere so that Al of the aluminum layer at the interface of the aluminum layer and the substrate is bonded with oxygen and the alumina ($Al_2O_3$) layer is formed. FIGS. 4a and 4b schematically illustrate a bonding step for forming a back reflective structure in a method for manufacturing a LED in accordance with one embodiment of the present invention.

FIG. 4a schematically shows a chamber 100 used in the manufacturing method of this embodiment of the present invention. Within the chamber 100, upper and lower jigs 110b and 110a are prepared under an oxygen atmosphere so as to compress a laminated structure. A substrate 122 is located on the lower jig 110a within the chamber 100 so that the upper surface of the substrate 122 is turned down. Herein, as described above, the upper surface of the substrate 122 is provided with a LED area 120 comprising a first conductive clad layer, an active layer, and a second conductive clad layer. An aluminum film 135 is disposed on the substrate 122. Then, the substrate 122 and the aluminum film 135 are heated and compressed by means of the upper and lower jigs 110b and 110a so that the aluminum film 135 is bonded to the substrate 122.

In the bonding step, since the aluminum film 135 is heated and compressed under the oxygen atmosphere, the upper and lower surfaces of the aluminum film 135 are reacted with oxygen. As a result, as shown in FIG. 4b, the aluminum film 135 is changed to an aluminum layer 135' having aluminum (Al$_2$O$_3$) layers 137 and 139 respectively formed on its lower and upper surfaces. Herein, the alumina layer 137 formed on the interface of the substrate 122 and the aluminum layer 135' has lower reflectance than that of the aluminum layer 135', and forms a reflective structure together with the aluminum layer 135'. Further, the alumina layer 139 exposed to the outside serves to protect the aluminum layer 135' from external stresses.

In the aforementioned aluminum layer bonding step, it is important to properly form the alumina layer 137 serving as the reflective layer. Particularly, in order to form a firm bonding structure between the substrate 122 and the aluminum film 135, the content of Al of the alumina layer 137 is properly limited in a designated range.

For this purpose, the interior of the chamber 100 is under an oxygen atmosphere, and a pressure applied in the bonding step is preferably in the range of approximately 30 gf/cm$^2$ to approximately 300 gf/cm$^2$.

Preferably, a heating temperature applied in the bonding step is more than approximately 250° C. in consideration of a glass transition temperature (T$_g$) of aluminum of approximately 400° C. and the above pressure condition. However, since the aluminum layer and other layers are deformed at an excessively high temperature, more preferably, the heating temperature does not exceed approximately 500° C.

In the bonding step shown in FIG. 4a, a designated DC voltage is applied to the substrate 122 by connecting a power to the lower jig 110a within the chamber 100.

Therefore, in the bonding step, Al ions of the aluminum film 135 move to the substrate 122 by applying a designated DC voltage to the substrate 122. Thereby, a firm bonding structure between the aluminum film 135 and the substrate 122 is obtained.

Further, a glass layer (not shown) may be formed on the lower surface of the LED. In this case, similarly to the manner of FIG. 4a, the aluminum film is disposed between the substrate 122 and the glass layer, and bonded thereto by an anode bonding process. Herein, since the glass layer sufficiently serves as a supporter, preferably, the substrate 122 is partially removed so as to achieve miniaturization of the LED.

Figure 5:
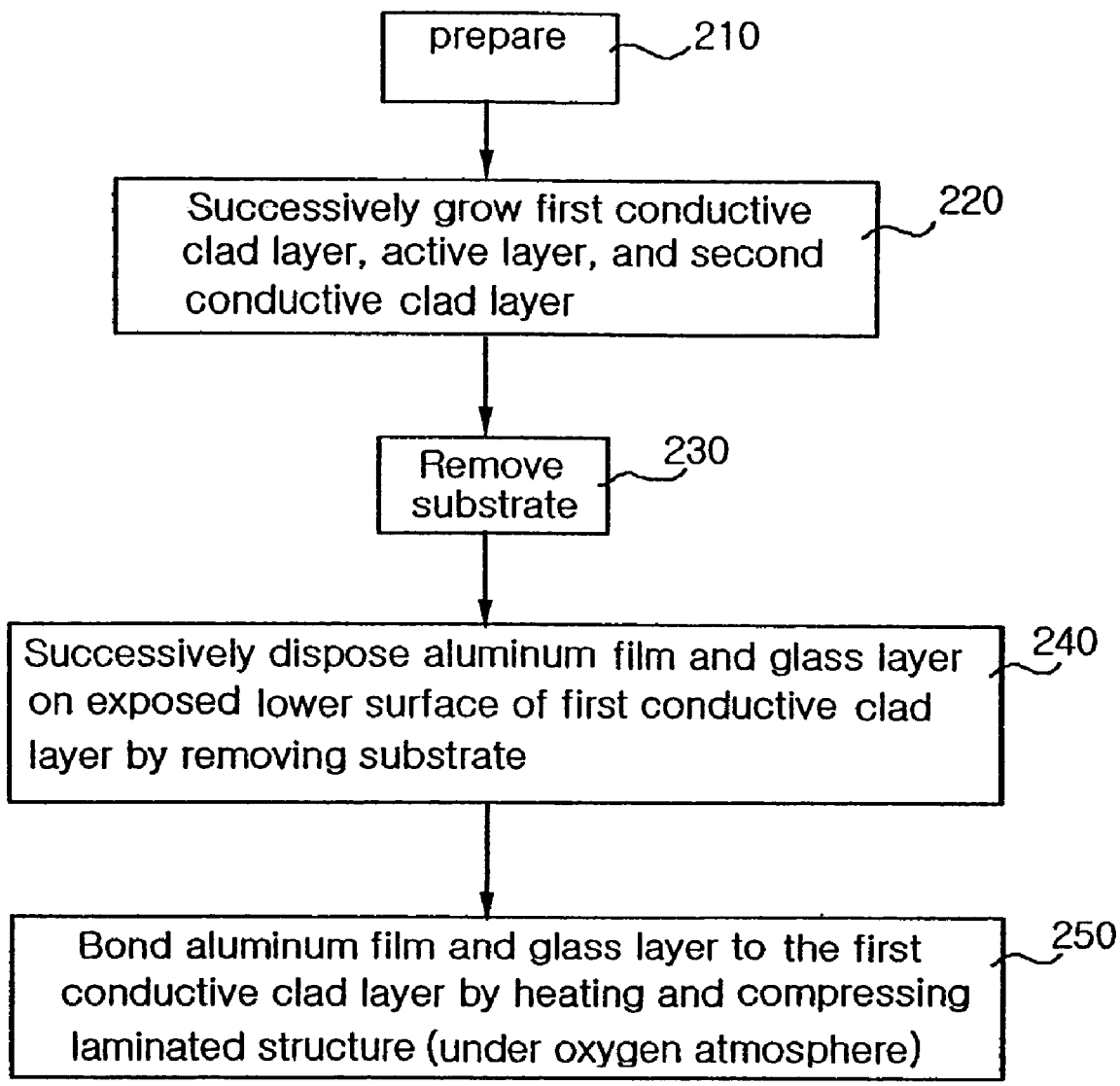
FIG. 5 is a flow chart illustrating a method for manufacturing a LED in accordance with another embodiment of the present invention.

Differently from the above-described method for manufacturing the LED, there is provided another method for manufacturing a LED comprising the step of removing a substrate and using a glass layer. FIG. 5 is a flow chart illustrating a method for manufacturing a LED in accordance with another embodiment of the present invention.

With reference to FIG. 5, the method for manufacturing the LED in accordance with another embodiment of the present invention starts from step 210 for preparing a substrate. Then, a first conductive clad layer, an active layer, and a second conductive clad layer are successively formed on the substrate (step 220).

In step 230, the substrate is removed so as to expose the lower surface of the first conductive clad layer. An aluminum film and a glass layer are successively disposed on the lower surface of the first conductive clad layer under an oxygen atmosphere (step 240). Next, the laminated structure is heated and compressed so that the aluminum film and the glass layer are bonded to the first conductive clad layer (step 250). Thereby, like the LED 50 of FIG. 3, a back reflective structure comprising the aluminum layer and the alumina layer formed on the glass layer is obtained.

Figure 6A:
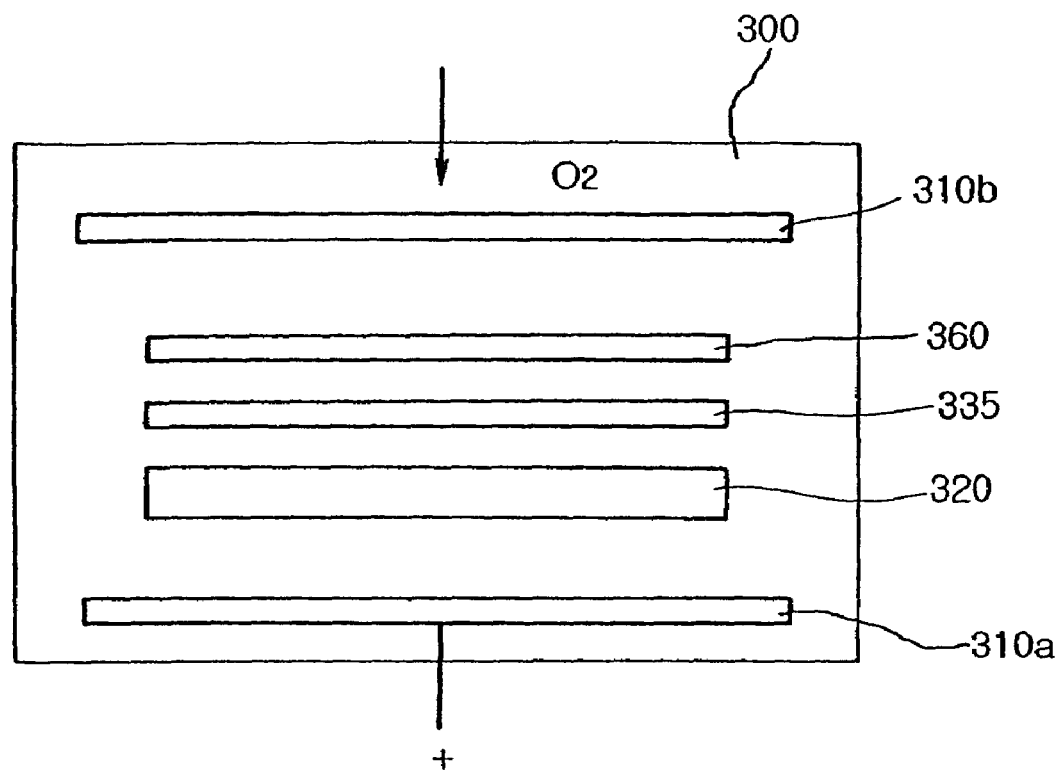
FIGS. 6a and 6b are schematic views illustrating a bonding step for forming a back reflective structure in a method for manufacturing a LED in accordance with another embodiment of the present invention.
Figure 6B:
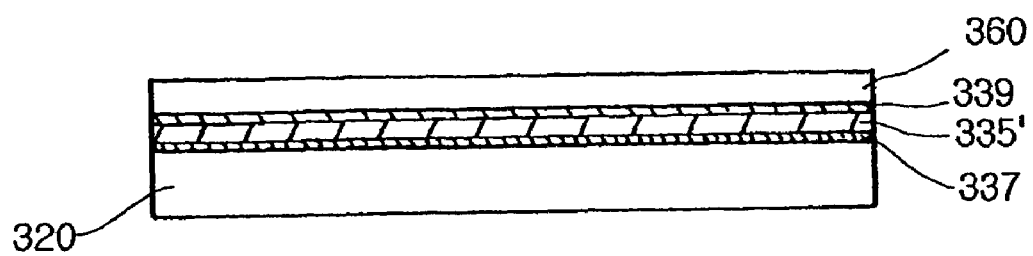

FIGS. 6a and 6b are schematic views illustrating a bonding step for forming a back reflective structure in a method for manufacturing the LED shown in FIG. 5.

Similarly to the chamber 100 of FIG. 4a, FIG. 6a schematically shows a chamber 300 used in the manufacturing method of this embodiment of the present invention. Within the chamber 300, upper and lower jigs 310b and 310a are prepared under an oxygen atmosphere so as to compress a laminated structure. A LED device 320 obtained by step 230 of FIG. 5, in which the substrate is removed, is located on the lower jig 310a within the chamber 300 so that the lower surface of a first conductive clad layer is turned up. An aluminum film 335 is disposed on the lower upper surface of the first conductive clad layer. Then, the laminated structure is heated and compressed by means of the upper and lower jigs 310b and 310a so that the aluminum film 335 is bonded to the first conductive clad layer.

In the bonding step using the equipment of FIG. 6a, since the aluminum film 335 is heated under the oxygen atmosphere, the upper and lower surfaces of the aluminum film 335 are reacted with oxygen. As a result, as shown in FIG. 6b, the aluminum film 335 is changed to an aluminum layer 335' having aluminum (Al$_2$O$_3$) layers 337 and 339 respectively formed on its lower and upper surfaces. Herein, the alumina layer 337 having an interface with the first conductive clad layer has lower reflectance than that of the aluminum layer 335', and forms a reflective structure together with the aluminum layer 335'.

In order to obtain the alumina layer 337 with desirable reflective characteristics, as described above, the interior of the chamber 300 is under the oxygen atmosphere, and a pressure applied in the bonding step is preferably in the range of approximately 30 gf/cm$^2$ to approximately 300 gf/cm$^2$.

Preferably, a heating temperature applied in the bonding step is more than approximately 250° C. in consideration of the above pressure condition. However, since the aluminum layer and other layers are deformed at an excessively high temperature, more preferably, the heating temperature does not exceed approximately 500° C.

As apparent from the above description, one embodiment of the present invention provides a LED comprising a reflective layer formed on the lower surface of the LED, including an aluminum layer and an alumina layer with different reflectances, thereby improving reflective characteristics of the reflective layer. Further, another embodiment of the present invention provides a LED comprising a reflective layer formed on an exposed surface of the LED after removing a substrate therefrom, including an aluminum layer and an alumina layer with different reflectances, thereby improving luminance the LED as well as reflective characteristics the LED.

Moreover, the present invention provides a method for manufacturing a LED, in which an aluminum layer is compressed to an area for a reflective layer on the surface of the LED at a high temperature under an oxygen atmosphere, thereby easily forming the aluminum layer, and simultaneously obtaining a reflective structure including the aluminum layer and an alumina layer with different reflectances. Therefore, a LED with excellent luminance is manufactured by a simple process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A light emitting diode, comprising:
   a sapphire substrate;
   a first conductive clad layer formed on the substrate;
   an active layer formed on the first conductive clad layer;
   a second conductive clad layer formed on the active layer;
   an alumina ($Al_2O_3$) layer formed on the lower surface of the substrate;
   an aluminum layer formed on the lower surface of the alumina ($Al_2O_3$) layer;
   a glass layer formed on the lower surface of the aluminum layer; and
   another alumina ($Al_2O_3$) layer formed between the aluminum layer and the glass layer.

2. The light emitting diode as set forth in claim 1, wherein the first and second conductive clad layers are made of a semiconductor material of a GaN compound.

3. A light emitting diode, comprising:
   a sapphire substrate;
   a first conductive clad layer formed on the substrate;
   an active layer formed on the first conductive clad layer;
   a second conductive clad layer formed on the active layer;
   an alumina ($Al_2O_3$) layer formed on the lower surface of the substrate;
   an aluminum layer formed on the lower surface of the alumina ($Al_2O_3$) layer;
   a high reflectivity structure that is formed on the lower surface of the substrate and includes two layers with different reflectivities, thereby exhibitina a blab reflectivity, wherein the two layers of the high reflector structure include said alumina ($Al_2O_3$) layer formed on the lower surface of the substrate and said aluminum layer formed on the lower surface of the alumina ($Al_2O_3$) layer;
   a glass layer formed on the lower surface of the aluminum layer; and
   another alumina ($Al_2O_3$) layer formed between the aluminum layer and the glass layer.

4. The light emitting diode as set forth in claim 3, wherein the first and second conductive clad layers are made of a semiconductor material of a GaN compound.

5. A light emitting diode, comprising:
   first and second reflective layers having different reflectivities, said second reflective layer being positioned on top of the first reflective layer and defining together with said first reflective layer a reflective structure;
   a sapphire substrate positioned on to of the second reflective layer;
   a first conductive clad layer positioned on top of the substrate;
   an active layer positioned on top of the first conductive clad layer;
   a second conductive clad layer positioned on top of the active layer; and
   a glass layer;
   wherein
   the first reflective layer is an aluminum layer and the second reflective layer is an alumina ($Al_2O_3$) layer positioned on top of the aluminum layer to define said reflective structure; and
   said aluminum layer is positioned on top of said glass layer;
   said light emitting diode further comprising another alumina ($Al_2O_3$) layer positioned between the aluminum layer and the glass layer.

* * * * *